US009653366B2

(12) United States Patent
Miyata et al.

(10) Patent No.: US 9,653,366 B2
(45) Date of Patent: May 16, 2017

(54) METHOD OF DIVIDING WAFER

(71) Applicant: DISCO CORPORATION, Tokyo (JP)

(72) Inventors: Satoshi Miyata, Tokyo (JP); Makoto Tanaka, Tokyo (JP); Sombat Chanvilai, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/080,919

(22) Filed: Mar. 25, 2016

(65) Prior Publication Data
US 2016/0293501 A1 Oct. 6, 2016

(30) Foreign Application Priority Data

Mar. 31, 2015 (JP) ................. 2015-071638

(51) Int. Cl.
H01L 21/304 (2006.01)
H01L 21/66 (2006.01)
H01L 21/78 (2006.01)
H01L 21/683 (2006.01)
H01L 21/67 (2006.01)

(52) U.S. Cl.
CPC ........ H01L 22/20 (2013.01); H01L 21/67092 (2013.01); H01L 21/6836 (2013.01); H01L 21/78 (2013.01); H01L 22/12 (2013.01); H01L 2221/68327 (2013.01)

(58) Field of Classification Search
CPC ....... H01L 2924/00014; H01L 2924/00; H01L 2924/00012; H01L 21/78; H01L 21/6836
See application file for complete search history.

(56) References Cited

U.S. PATENT DOCUMENTS

| 5,972,154 A | * | 10/1999 | Konya | .................. | B23P 25/003 156/268 |
| 6,346,034 B1 | * | 2/2002 | Leng | ..................... | B28D 5/023 125/13.01 |
| 6,663,740 B2 | * | 12/2003 | Yamasaki | ........... | B32B 38/0004 156/248 |
| 2002/0076848 A1 | * | 6/2002 | Spooner | .............. | B81C 1/00888 438/48 |
| 2009/0004859 A1 | * | 1/2009 | Kimura | ................. | H01L 21/304 438/691 |

(Continued)

FOREIGN PATENT DOCUMENTS

| JP | 2005-142202 | 6/2005 |
| JP | 2011-088223 | 5/2011 |

(Continued)

Primary Examiner — Jaehwan Oh
(74) Attorney, Agent, or Firm — Greer Burns & Crain, Ltd.

(57) ABSTRACT

Disclosed herein is a method of dividing a wafer including an exposed area incising step of lowering a cutting blade to a preset lowered position for fully severing the wafer to cause the cutting blade to incise an exposed area of a wafer unit, an image capturing step of capturing an image of the exposed area which the cutting blade has incised in the exposed area incising step, with image capturing means, a determining step of determining whether or not it is possible to fully sever the wafer on the basis of the captured image in the image capturing step, and an adjusting step of increasing a distance by which to lower the cutting blade if it is determined that it is impossible to fully sever the wafer in the determining step.

2 Claims, 6 Drawing Sheets

(56) References Cited

U.S. PATENT DOCUMENTS

| | | | | |
|---|---|---|---|---|
| 2010/0297831 A1* | 11/2010 | Morikazu | ......... | H01L 21/67132 |
| | | | | 438/463 |
| 2012/0100694 A1* | 4/2012 | Kajiyama | ................ | H01L 21/78 |
| | | | | 438/462 |
| 2014/0073067 A1* | 3/2014 | Uchida | .................... | H01L 21/78 |
| | | | | 438/5 |
| 2015/0364375 A1* | 12/2015 | Nakamura | ............ | H01L 21/268 |
| | | | | 438/462 |
| 2016/0027696 A1* | 1/2016 | Nagaoka | ............. | H01L 21/6835 |
| | | | | 438/14 |

FOREIGN PATENT DOCUMENTS

| | | |
|---|---|---|
| JP | 2013-027949 | 2/2013 |
| JP | 2013027949 A * | 2/2013 |

\* cited by examiner

METHOD OF DIVIDING WAFER

BACKGROUND OF THE INVENTION

Field of the Invention

The present invention relates to a method of dividing a wafer.

Description of the Related Art

Cutting apparatus for cutting a wafer with a cutting blade operate by holding the wafer adhered to an adhesive tape on the holding surface of a chuck table, thrusting the cutting blade which is rotating at a high speed to incise the wafer held on the chuck table, and cutting the wafer until the tip end of the cutting blade reaches the adhesive tape, thereby fully severing the wafer. The cutting apparatus are capable of fully severing the wafer because they recognize the vertical position of the holding surface of the chuck table holding the wafer and the vertical position of the tip end of the cutting blade (see, for example, Japanese Patent No. 4549654), calculate how deep the tip end of the cutting blade is to incise the adhesive tape from the reference position where the tip end of the cutting blade contacts the holding surface of the chuck table, depending on the thickness of the adhesive tape being used, lower the cutting blade until the tip end thereof reaches a position based on the calculated depth in an incising feed mode, and move (cutting feed mode) the cutting blade with respect to the wafer thereby to cut the wafer in a cutting feed mode.

The cutting blade that is used to cut the wafer has such a property that it is progressively worn as the cutting process continues. When the cutting blade has cut a certain amount of wafer in the cutting process, the actual depth by which the cutting blade has cut into the wafer is smaller than the calculated depth by which the cutting blade is to cut into the wafer. Therefore, when the cutting blade has cut a certain amount of wafer, the tip end of the cutting blade is detected again by position detecting means such as an optical sensor or the like, and the depth by which the cutting blade has incised the wafer is managed so that it will reach a depth required to fully sever the wafer (see, for example, Japanese Patent No. 5389604). Alternatively, when the cutting blade has cut a certain amount of wafer, the cutting blade is actuated in the incising feed mode, but not in the cutting feed mode, to incise a cut mark bearing workpiece to leave a cut mark thereon, then the diameter of the cutting blade is calculated from the length of the cut mark, and the depth by which the cutting blade has incised the wafer is managed so that it will reach a depth required to fully sever the wafer (see, for example, Japanese Patent Laid-Open No. 2013-27949).

SUMMARY OF THE INVENTION

According to the process of managing the depth by which the cutting blade has cut the wafer by detecting the tip end of the cutting blade in a contactless fashion with the position detecting means such as an optical sensor or the like as disclosed in Japanese Patent No. 5389604, however, it is necessary to detect the tip end of the cutting blade after chips produced in the cutting process have been removed and to move the tip end of the cutting blade to a detector of the position detecting means. Therefore, it is time-consuming to detect the tip end of the cutting blade, resulting in a reduction in cutting efficiency. According to the process of managing the depth by which the cutting blade has cut the wafer by calculating the diameter of the cutting blade from the cut mark as disclosed in Japanese Patent Laid-Open No. 2013-27949, since the cutting blade needs to be moved to a cut mark forming unit which is provided with the cut mark bearing workpiece, it is also time-consuming to detect the tip end of the cutting blade, resulting in a reduction in cutting efficiency.

Therefore, it is an object of the present invention to provide a method of dividing a wafer in a manner to manage the depth by which a cutting blade has cut the wafer so that it will reach a depth required to fully sever the wafer while at the same time preventing a reduction in cutting efficiency when the cutting blade is caused to incise the wafer to fully sever the wafer.

In accordance with an aspect of the present invention, there is provided a method of dividing a wafer having projected dicing lines thereon by holding on a chuck table a wafer unit which includes the wafer adhered to an adhesive tape that is adhered to a ring frame in closing relation to an opening of the ring frame, with an exposed area in which the adhesive tape is exposed between an outer circumferential edge of the wafer and an inner circumferential edge of the ring frame, and fully severing the wafer by a cutting blade along the projected dicing lines. The method includes an exposed area incising step of lowering the cutting blade to a preset lowered position for fully severing the wafer to cause the cutting blade to incise the exposed area of the wafer unit, an image capturing step of capturing an image of an area incised by the cutting blade with image capturing means in the exposed area incising step, a determining step of determining whether or not it is possible to fully sever the wafer on the basis of the image captured in the image capturing step, and an adjusting step of increasing a distance by which to lower the cutting blade if it is determined that it is impossible to fully sever the wafer in the determining step.

The method of dividing a wafer according to the present invention includes the exposed area incising step of lowering the cutting blade to a preset lowered position for fully severing the wafer to cause the cutting blade to incise the exposed area of the wafer unit, the image capturing step of capturing an image of the exposed area which the cutting blade has incised, with image capturing means, the determining step of determining whether or not it is possible to fully sever the wafer on the basis of the captured image, and the adjusting step of increasing a distance by which to lower the cutting blade if it is determined that it is impossible to fully sever the wafer. Therefore, an image is captured to check if a cut mark is formed in the exposed area or not, and it is determined whether or not it is possible to fully sever the wafer on the basis of the captured image. If it is determined that it is impossible to fully sever the wafer, then the distance by which to lower the cutting blade is increased, and the wafer is cut by the cutting blade which has been lowered by the distance increased to fully sever the wafer. Consequently, the wafer is prevented from being not fully severed by the cutting blade while at the same time preventing a reduction in cutting efficiency due to movement of the cutting blade to other units.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A cutting apparatus 1 used to carry out a method of dividing a wafer according to an embodiment of the present invention, a wafer W1 to be divided by the cutting apparatus 1, and a setup process for determining a reference position for the descent of a cutting blade 60 will be described below with reference to FIGS. 1 through 3.

Figure 1:
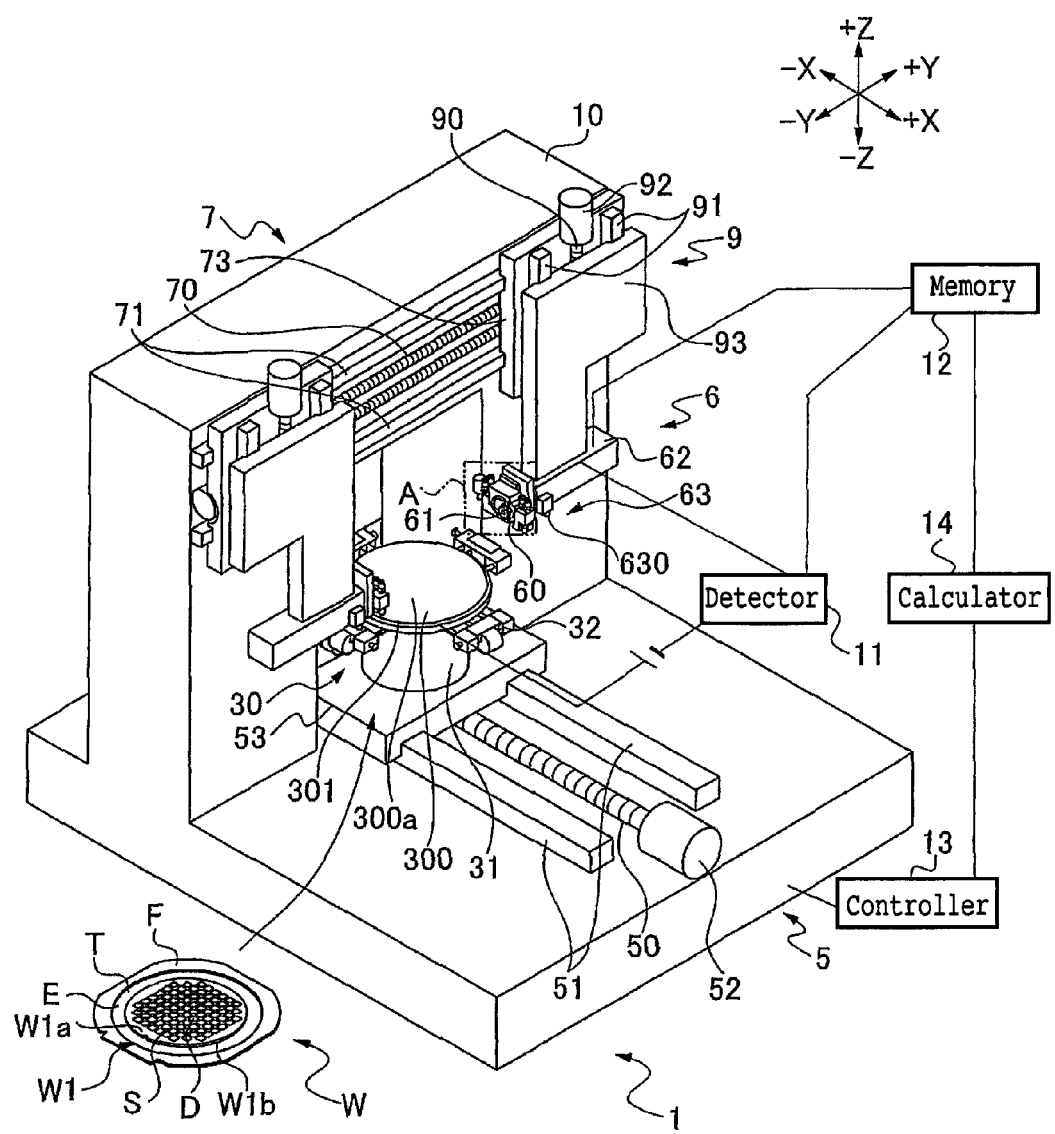
FIG. 1 is a perspective view of a cutting apparatus for carrying out a method of dividing a wafer according to an embodiment of the present invention.

The wafer W1 shown in FIG. 1 includes a semiconductor wafer with a number of devices D formed in grid-like areas separated by projected dicing lines S on a surface W1a of the wafer W1. The wafer W1 is supported on a ring frame F by an adhesive tape T having a thickness of about 100 μm, making up a wafer unit W. While the wafer unit W is being held on a chuck table 30, the wafer W1 is cut by the cutting apparatus 1. The wafer W1 is not limited to any shapes and types. Though the thickness of the adhesive tape T is of about 100 μm in the present embodiment, it may be varied depending on the type of the wafer W1, the thickness of the wafer W1, the cutting blade, and other factors.

The wafer unit W is fabricated as follows: The wafer W1 and the ring frame F are positioned with respect to each other so that the wafer W1 is positioned radially inwardly of the ring frame F. At this time, the wafer W1 is positioned centrally in the opening of the ring frame F. After the wafer W1 and the ring frame F have been positioned with respect to each other, the adhesive surface of the adhesive tape T is pressed against a reverse side W1b of the wafer W1, thereby applying the adhesive tape T to the reverse side W1b of the wafer W1. At the same time, an outer circumferential portion of the adhesive surface of the adhesive tape T is applied to the ring frame F, thereby closing the opening of the ring frame F. The wafer unit W in which the wafer W1 is supported on the ring frame F by the adhesive tape T is now completed. The wafer unit W thus formed has an exposed area E where the adhesive surface of the adhesive tape T is exposed between the outer circumferential edge of the wafer W1 and the inner circumferential edge of the ring frame F.

The cutting apparatus 1 shown in FIG. 1, which is used to divide the wafer W1 by the method of dividing a wafer according to the present embodiment, is an apparatus which cuts the wafer W1 with cutting means 6 including a cutting blade 60 while the wafer unit W held on the chuck table 30 is being moved in a cutting feed mode along a cutting feed direction indicated as an X-axis direction by cutting feed means (cutting feed unit) 5.

The cutting feed means 5 on the cutting apparatus 1 includes a ball screw 50 having an axis extending along X-axis directions, a pair of guide rails 51 disposed parallel to the ball screw 50, a pulse motor 52 for rotating the ball screw 50 about its own axis, and a movable plate 53 having an inner nut threaded over the ball screw 50 and bottom surfaces held in sliding contact with the guide rails 51. When the pulse motor 52 is energized, the ball screw 50 rotates about its own axis, causing the movable plate 53 to move back and forth along the X-axis directions while being guided by the guide rails 51. The chuck table 30 is disposed on the movable plate 53. The pulse motor 52 is energized by a pulsed signal from a controller 13.

The chuck table 30 has a circular outer profile, for example, and includes a suction unit 300 for attracting the wafer W1 under suction and a frame body 301 supporting the suction unit 300. The suction unit 300 is held in fluid communication with a suction source, not shown, and includes a holding surface 300a for holding the wafer W1 under suction, the holding surface 300a serving as an exposed surface of the suction unit 300 and lying flush with the upper surface of the frame body 301. The chuck table 30 is rotatably supported by rotating means 31 which is connected to the bottom surface of the chuck table 30. Fixing means 32 for fixing the ring frame F is disposed on peripheral portions of the chuck table 30. The suction unit 300 is made of porous ceramics, for example, and the frame body 301 is made of an electrically conductive material such as metal, for example.

A wall 10 is erected in a rear area on the cutting apparatus 1 along a −X-axis direction, and supports thereon indexing feed means (indexing feed mechanism) 7 for feeding the cutting means (cutting unit) 6 in Y-axis directions. The indexing feed means 7 includes a ball screw 70 having an axis extending along the Y-axis directions, a pair of guide rails 71 disposed parallel to the ball screw 70, a pulse motor, not shown, for rotating the ball screw 70 about its own axis, and a movable plate 73 having an inner nut threaded over the ball screw 70 and side surfaces held in sliding contact with the guide rails 71. When the non-illustrated pulse motor is energized, the ball screw 70 rotates about its own axis, causing the movable plate 73 to move back and forth along the Y-axis directions while being guided by the guide rails 71. Incising feed means 9 for feeding the cutting means 6 along Z-axis directions is disposed on the movable plate 73. The non-illustrated pulse motor is energized by a pulsed signal from the controller 13.

The incising feed means (incising feed mechanism) 9 includes a ball screw 90 having an axis extending along Z-axis directions, a pair of guide rails 91 disposed parallel to the ball screw 90, a pulse motor 92 for rotating the ball screw 90 about its own axis, and a movable plate 93 having an inner nut threaded over the ball screw 90 and side surfaces held in sliding contact with the guide rails 91. When the number of pulses is supplied to the pulse motor 92 to energize the pulse motor 92, the ball screw 90 rotates about its own axis, causing the movable plate 93 to move back and forth along the Z-axis directions while being guided by the guide rails 91. The cutting means 6 is connected to the movable plate 93. The pulse motor 92 is energized by a pulsed signal from a controller 13.

The cutting means 6 includes a spindle 61 extending horizontally (along the Y-axis directions in FIG. 1) perpendicularly to the directions along which the movable plate 53 is movable, a housing 62 by which the spindle 61 is rotatably supported, and the cutting blade 60 fixed to the spindle 61 for rotation therewith about its own axis. Alignment means (alignment unit) 63 is disposed on a side surface of the housing 62 for capturing an image of an area to be cut of the wafer W1 and detecting its position. The alignment means 63 includes an alignment camera 630 for capturing an image of the surface W1a of the wafer W1. On the basis of the image captured by the alignment camera 630, the alignment means 63 can detect a projected dicing line S along which to cut the wafer W1 by performing an image processing process such as pattern matching or the like on the captured image.

Figure 2:
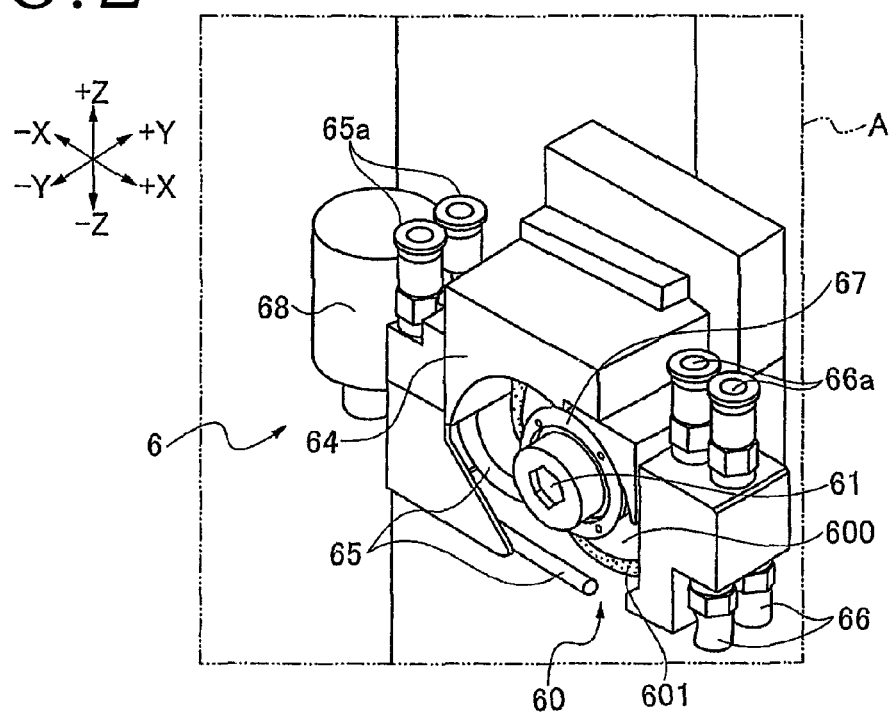
FIG. 2 is an enlarged perspective view of an enclosed portion A shown in FIG. 1.

As shown in FIG. 2, the cutting blade 60 has a cutting edge 601 secured to the peripheral edge of a disk-shaped base 600, and is fastened to the spindle 61 by a nut 67. A blade cover 64 covers the cutting blade 60 along a +Z-axis direction. A pair of cutting liquid nozzles 65 for supplying a cutting liquid to both surfaces of the cutting edge 601 are disposed in front of and behind the cutting edge 601 along the Y-axis directions. Another pair of cutting liquid nozzles 66 for ejecting a cutting liquid are disposed in a region on an extension of the plane of the cutting edge 601. The cutting liquid ejected from the cutting liquid nozzles 65 and 66 flows in from cutting liquid inlets 65a and 66a, respectively.

On the blade cover 64, for example, there is mounted image capturing means (image capturing unit) 68 for capturing an image of an area, where the cutting blade 60 is to incise the wafer W1, in the exposed area E of the wafer W1 shown in FIG. 1. The image capturing means 68 includes, for example, a camera incorporating a CCD image sensor or the like, but may not necessarily be limited to such a camera.

For reliably cutting the wafer W1, it is necessary to control, with high accuracy, the depth by which to incise the wafer W1. To this end, before actually cutting the wafer W1, the cutting apparatus 1 sets up the cutting blade 60 to keep the accuracy with respect to the depth by which to incise the wafer W1.

Figure 3:
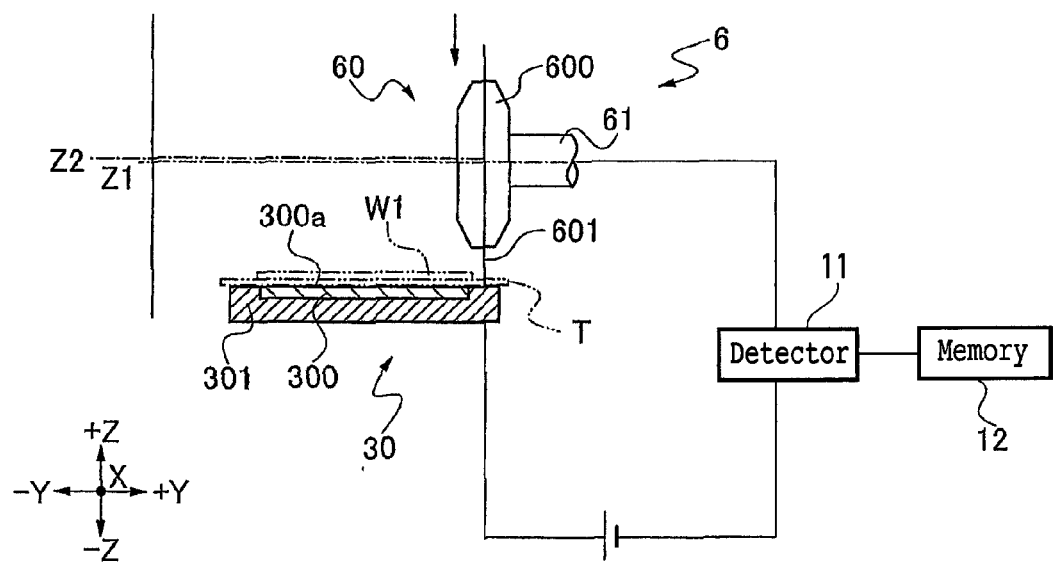
FIG. 3 is a view showing the manner in which a cutting blade is set up using a chuck table.

As shown in FIG. 3, a setup process for the cutting blade 60 prior to the actual cutting of the wafer W1 is carried out by lowering the cutting means 6 along a −Z-axis direction, detecting an electrical conduction made when the cutting edge 601 of the cutting blade 60 contacts the upper surface of the frame body 301 of the chuck table 30, with a detector 11 connected to the cutting means 6, for example, and storing the position of the cutting blade 60 along the Z-axis directions upon detection of the electrical conduction in a memory 12 connected to the detector 11, for example. Specifically, when the cutting means 6 is lowered, the position of the cutting blade 60 along the Z-axis directions can be grasped on the basis of the number of pulses supplied to the pulse motor 92 shown in FIG. 1, and the position of the cutting blade 60 along the Z-axis directions at the time the cutting blade 60 contacts the upper surface of the frame body 301 can be determined as a reference position Z1. After the reference position Z1 of the cutting blade 60 along the Z-axis directions has been determined, the depth by which to incise the wafer W1 can be controlled on the basis of the reference position Z1.

For fully severing the wafer W1 with the cutting blade 60, consequently, in view of the fact that the cutting blade 60 also incises the adhesive tape T by a depth of about several tens μm, a predetermined lowered position to be reached by the cutting blade 60 is a position Z2 which is several tens μm higher than the reference position Z1 along the +Z-axis direction.

Various steps of the method of dividing the wafer W1 using the cutting apparatus 1 according to the present embodiment will be described below with reference to FIGS. 1 and 3 through 10. According to the present embodiment, it is assumed that the cutting blade 60 divides the wafer W1 after it has been worn from cutting the wafer or wafers a plurality of times after being subjected to an initial setup process, for example. Some parts of the cutting apparatus 1 are illustrated as simplified in FIGS. 5, 6, and 8.

(1) Exposed Area Incising Step

According to the present dividing method, an exposed area incising step is carried out to lower the cutting blade 60 shown in FIG. 1 to a preset lowered position where it will fully sever the wafer W1 and to cause the cutting blade 60 to incise into the exposed area E.

The wafer unit W shown in FIG. 1 is held on the chuck table 30 and fed along the −X-axis direction by the cutting feed means 5, and an image of the surface W1a of the wafer W1 is captured by the alignment camera 630, after which the alignment means 63 detects the position of a projected dicing line S along which to cut the wafer W1. When the projected dicing line S has been detected, the cutting means 6 is actuated to move along the Y-axis directions by the indexing feed means 7, positioning the projected dicing line S along which to cut the wafer W1 and the cutting blade 60 with respect to each other along the Y-axis directions.

Figure 4:
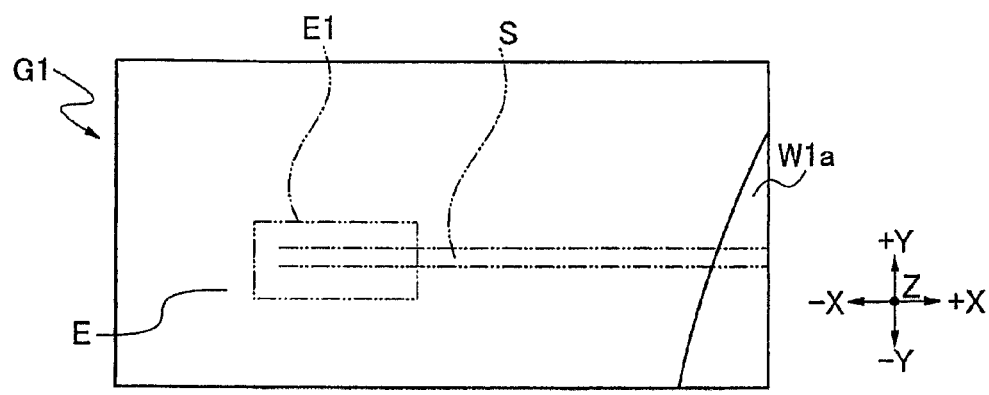
FIG. 4 is a plan view of an image captured before the cutting blade incises an adhesive tape.

Furthermore, the alignment camera 630, for example, captures an image G1, shown in FIG. 4, of the exposed area E before it is incised by the cutting blade 60, and the captured image G1 is stored in the memory 12. The image G1 may be captured by the image capturing means 68 instead of the alignment camera 630.

Figure 5:
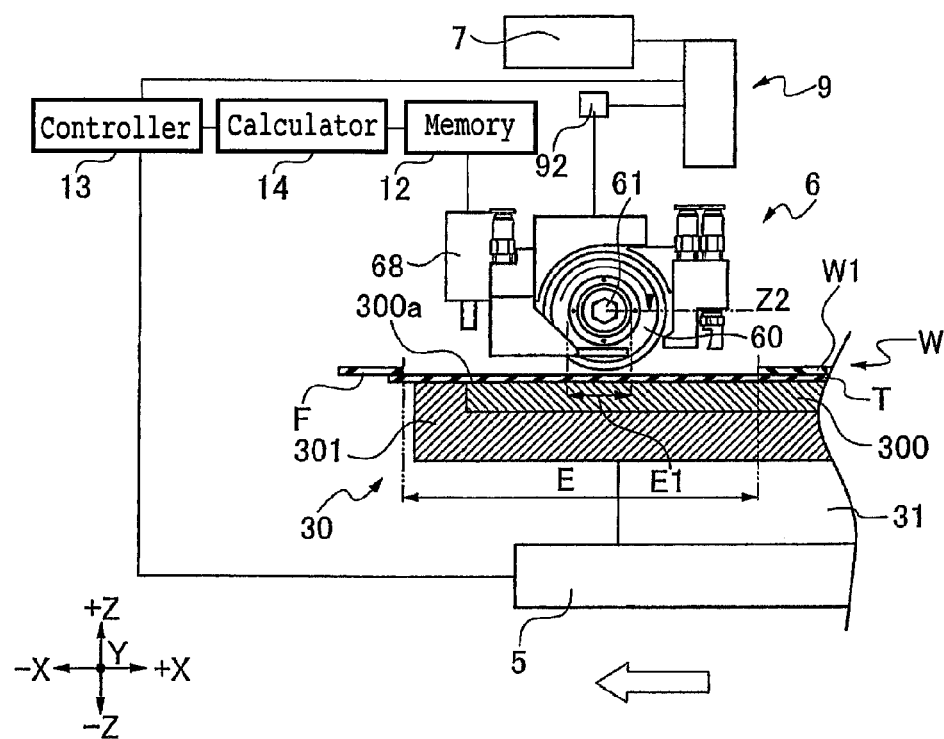
FIG. 5 is a cross-sectional view showing the manner in which the cutting blade is caused to incise an exposed area of a wafer in an exposed area incising step.

After the cutting blade 60 shown in FIG. 1 and the detected projected dicing line S have been positioned with respect to each other along the Y-axis directions by the indexing feed means 7, the cutting feed means 5 further feeds the chuck table 30 holding the wafer unit W along the −X-axis direction, as shown in FIG. 5, and the incising feed means 9 lowers the cutting blade 60 along the −Z-axis direction to the position Z2 that has been set for fully severing the wafer W1 with the cutting blade 60. At this time, a motor, not shown, rotates the spindle 61 about its own axis at a high speed, causing the cutting blade 60 fixed to the spindle 61 to rotate at the high speed and incise the adhesive tape T in an area E1 in the exposed area E.

Figure 6:
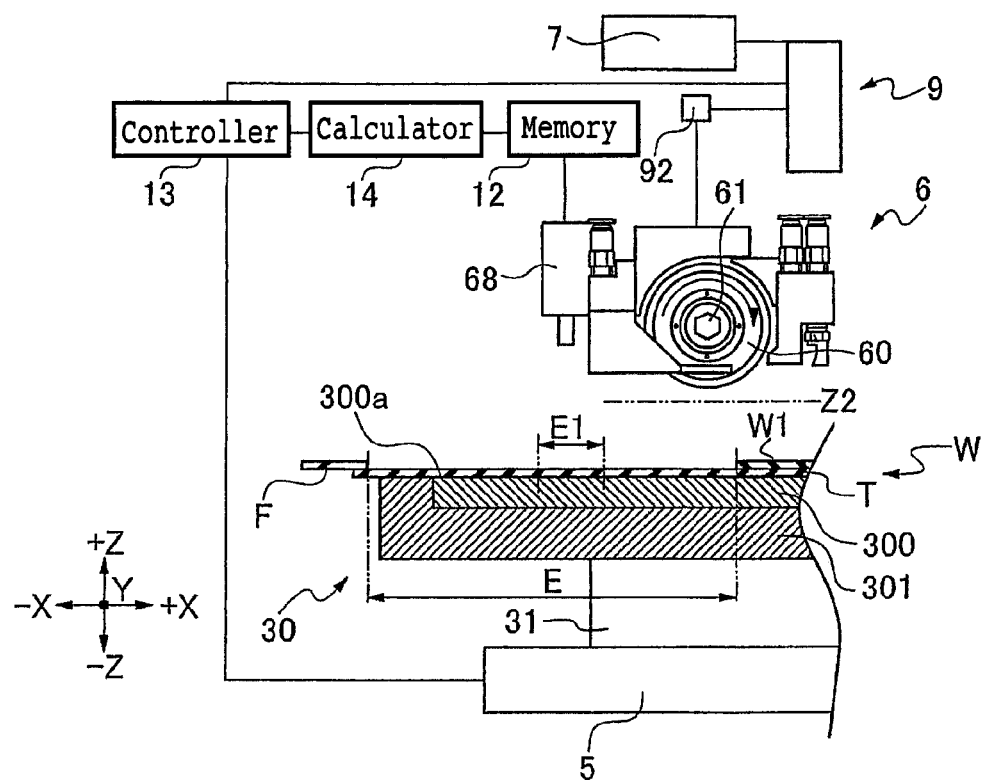
FIG. 6 is a cross-sectional view showing the manner in which an image of an area incised by the cutting blade is captured by image capturing means in an image capturing step.
Figure 7:
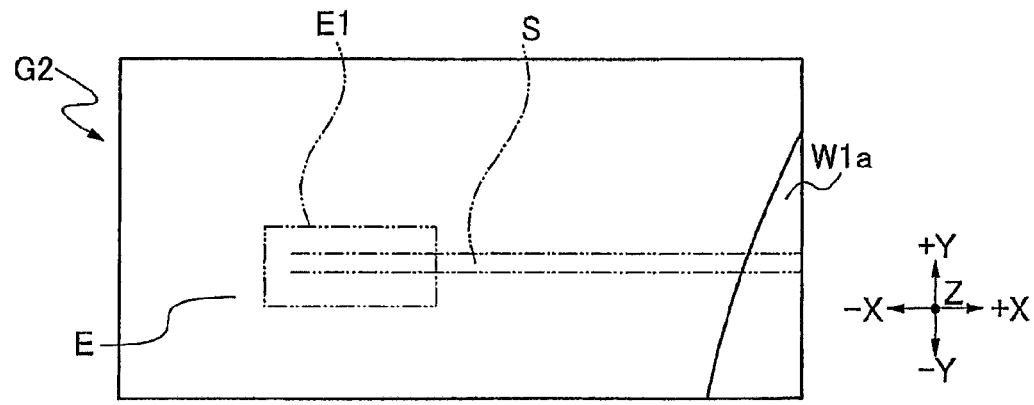
FIG. 7 is a plan view of an image captured in the image capturing step.

When the cutting blade 60 has been fed a predetermined distance along the −X-axis direction in the exposed area E, the cutting feed means 5, for example, temporarily stops feeding the wafer W1 along the −X-axis direction and the incising feed means 9 lifts the cutting blade 60 along the +Z-axis direction away from the wafer W1, as shown in FIG. 6.

(2) Image Capturing Step

After the exposed area incising step, the image capturing means 68 captures an image of the area E1, where the cutting blade 60 has incised the wafer W1 in the exposed area incising step, in the exposed area E, as shown in FIG. 6. The area E1 whose image is captured by the image capturing means 68 is in the same position as the area whose image has been captured by the image capturing means 68 in the exposed area incising step. An image G2 shown in FIG. 7 which has been captured by the image capturing means 68 is stored in the memory 12. The image G2 may be captured by the alignment camera 630 instead of the image capturing means 68.

(3) Determining Step

After the image capturing step, a determining step determines whether or not it is possible to fully sever the wafer W1 on the basis of the image captured in the image capturing step. Specifically, the image G2 shown in FIG. 7 which has been captured in the image capturing step and the image G1 shown in FIG. 4 which has been captured in the exposed area incising step are transmitted as digital signals from the memory 12 to a calculator 14 shown in FIG. 6. The calculator 14 performs a differential process such as a background differential process or the like on the captured image G1 and the captured image G2. The differential process carried out by the calculator 14 uses the captured image G1 as a background image and calculates the difference between the captured image G1 and the captured image G2. As no cut mark is included in the captured image G2, there is no difference between the captured image G1 and the captured image G2, and hence the calculator 14 determines that the length of a cut mark is 0 μm and determines that it is impossible to fully sever the wafer W1 at the position Z2 that has been set for fully severing the wafer W1 with the cutting blade 60 shown in FIG. 6. The calculator 14 then transmits the decision that it is impossible to fully sever the wafer W1 as a digital signal to the controller 13. In the determining step, the captured image G2 may be displayed on a display monitor, not shown, to allow the operator to confirm whether there is a cut mark or not.

In response to the decision that it is impossible to fully sever the wafer W1, the controller 13 controls the cutting feed means 5 to feed the chuck table 30 along the +X-axis direction back to the original position.

(4) Adjusting Step

Figure 8:
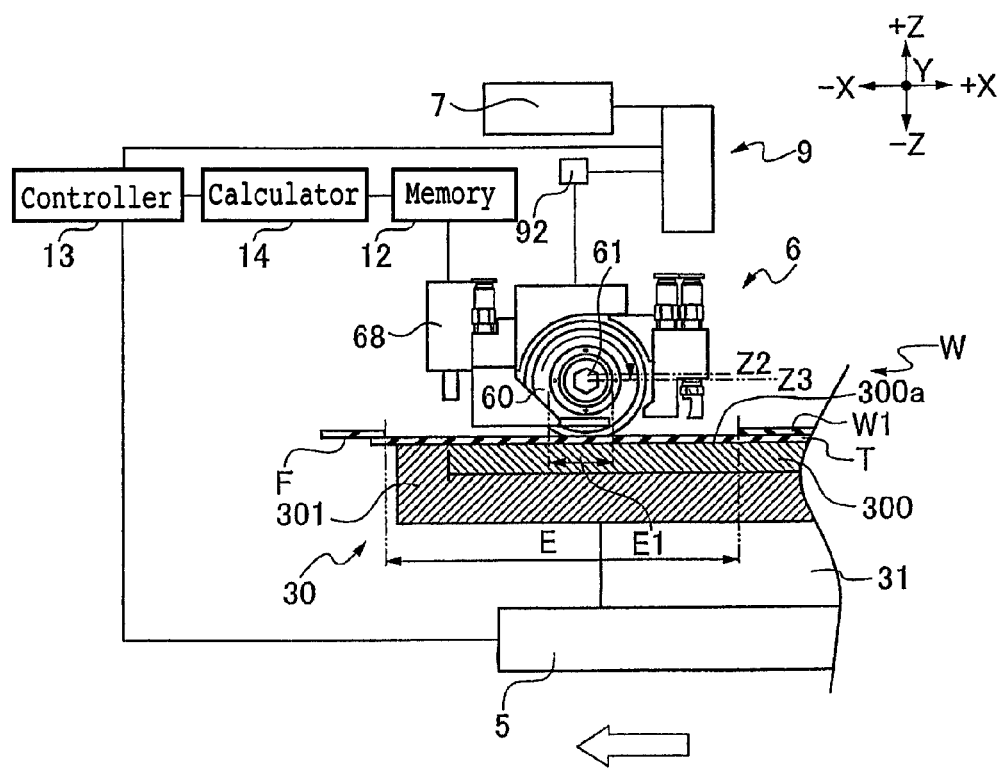
FIG. 8 is a cross-sectional view showing the manner in which a distance by which to lower the cutting blade is adjusted in an adjusting step.

The determining step is followed by an adjusting step for increasing the distance by which to lower the cutting blade 60 on the basis of the decision from the determining step. In the adjusting step, for example, the number of pulses sent from the controller 13 to the pulse motor 92 is increased to cause the incising feed means 9 to lower the cutting blade 60 to a position Z3 shown in FIG. 8. The position Z3 refers to a position which is about several tens μm lower than the position Z2 along the −Z-axis direction, as shown in FIG. 8. The position Z3 is a position that is variable depending the thickness of the adhesive tape T or the like. For example, the position Z3 may refer to a position which is lower than the position Z2 along the −Z-axis direction by a distance slightly smaller than the thickness of the adhesive tape T.

(5) Exposed Area Incising Step

As shown in FIG. 8, after the distance by which to lower the cutting blade 60 has been increased, an exposed area incising step (second exposed area incising step) which is the same as the initial exposed area incising step is carried out.

(6) Image Capturing Step

After the second exposed area incising step, an image capturing step which is the same as the initial image capturing step is carried out. An image G3 shown in FIG. 9 which has been captured by the image capturing means 68 shown in FIG. 8 is stored in the memory 12. The image G3 may be captured by the alignment camera 630 instead of the image capturing means 68.

(7) Determining Step

Figure 9:
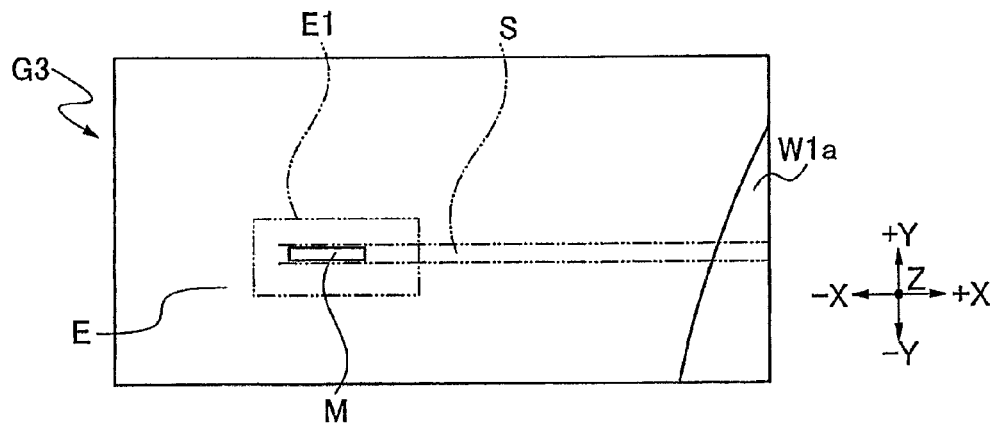
FIG. 9 is a plan view of an image captured in another image capturing step.
Figure 10:
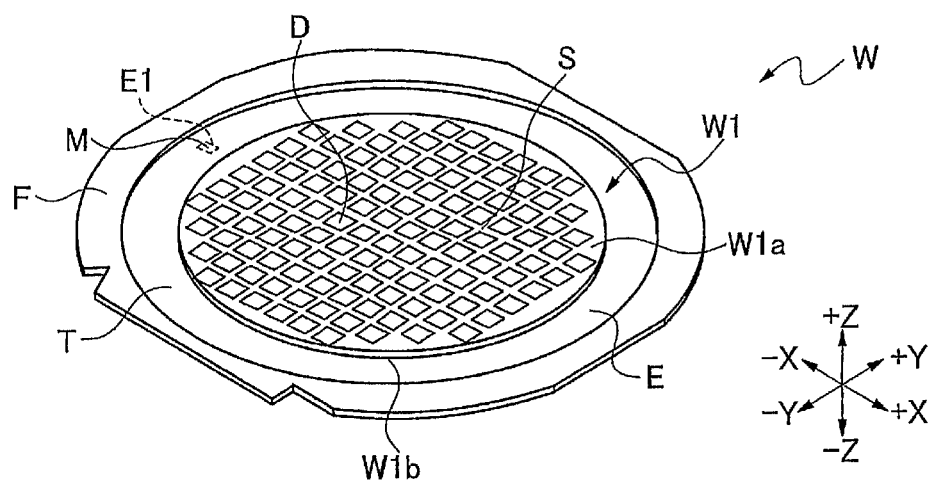
FIG. 10 is a perspective view of a wafer unit with a cut mark formed on a wafer.

In a second determining step, the image G3 shown in FIG. 9 which has been captured in the second image capturing step and the image G1 shown in FIG. 6 which has been captured in the exposed area incising step are transmitted as digital signals from the memory 12 to a calculator 14 shown in FIG. 8. The calculator 14 performs a differential process such as a background differential process or the like on the captured image G1 and the captured image G3. The differential process carried out by the calculator 14 uses the captured image G1 as a background image and calculates the difference between the captured image G1 and the captured image G3. As a cut mark M is included as a difference in the captured image G3, the calculator 14 determines that it is possible to fully sever the wafer W1 by lowering the cutting blade 60 to the position Z3. The calculator 14 then transmits the decision that it is possible to fully sever the wafer W1 as a digital signal to the controller 13.

In the determining step, a threshold value may be established in advance with respect to the length of a cut mark M along its longitudinal directions (the X-axis directions). In case there is a cut mark M in the area E1 of the wafer W1 shown in FIG. 10, if the calculator 14 decides that the longitudinal length of the cut mark M is smaller than the threshold value, then the calculator 14 may determine that it is impossible to fully sever the wafer W1. Furthermore, the calculator 14 may calculate a position to which the cutting blade 60 is to incise the wafer W1 along the Z-axis directions, from the length of the cut mark M along its longitudinal directions and the speed at which the cutting feed means 5 feeds the chuck table 30.

(8) Adjusting Step

Since the second determining step has determined that it is possible to fully sever the wafer W1, the distance by which to lower the cutting blade 60 is not increased in a second adjusting step. Instead, the incising feed means 9 lowers the cutting blade 60 to the position Z3 shown in FIG. 8, and the cutting feed means 5 feeds the chuck table 30 holding the wafer unit W further along the −X-axis direction.

(9) Cutting Step

Then, the cutting blade 60 fixed to the spindle 61 incises the wafer W1 while rotating at a high speed upon rotation of the spindle 61, and cuts the wafer W1 along the projected dicing line S shown in FIG. 1. When the wafer W1 moves on along the −X-axis direction to a prescribed position where the cutting blade 60 finishes cutting the wafer W1 entirely along the projected dicing line S, the cutting feed means 5 temporarily stops feeding the wafer W1, the incising feed means 9 lifts the cutting blade 60 away from the wafer W1, and the cutting feed means 5 feeds the chuck table 30 along the +X-axis direction back to the original position.

The above process from the exposed area incising step to the cutting step is similarly performed on each of adjacent projected dicing lines S, cutting the wafer W1 along all the projected dicing lines S that extend in one direction. The chuck table 30 is then turned 90 degrees by the rotating means 31, and then the above process from the exposed area incising step to the cutting step is similarly performed on each of adjacent projected dicing lines S extending perpendicularly to the previously cut projected dicing lines S. In this manner, the wafer W1 is fully severed along all the projected dicing lines S that are present in a grid pattern thereon. The process from the image capturing step to the adjusting step may not be carried out each time the wafer W1 is cut along each projected dicing line S, but may be carried out once each time the wafer W1 is cut along several projected dicing lines S.

As described above, an image is captured to check if a cut mark is formed in the exposed area E or not, and it is determined whether or not it is possible to fully sever the wafer W1 on the basis of the captured image. If it is determined that it is impossible to fully sever the wafer W1, then the distance by which to lower the cutting blade 60 is increased, and the wafer W1 is cut by the cutting blade 60 which has been lowered by the distance increased to fully sever the wafer W1. Consequently, the wafer W1 is prevented from being not fully severed by the cutting blade 60 while at the same time preventing a reduction in cutting efficiency due to movement of the cutting blade 60 to other units.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of dividing a wafer having projected dicing lines thereon by holding on a chuck table a wafer unit which includes the wafer adhered to an adhesive tape that is adhered to a ring frame in closing relation to an opening of the ring frame, with an exposed area in which the adhesive tape is exposed between an outer circumferential edge of the wafer and an inner circumferential edge of the ring frame, and fully severing the wafer by a cutting blade along the projected dicing lines, the method comprising:

an exposed area incising step of lowering the cutting blade to a preset lowered position for fully severing the wafer to cause the cutting blade to incise the exposed area of the wafer unit;

an image capturing step of capturing an image of an area incised by the cutting blade with image capturing means in the exposed area incising step;

a determining step of determining whether or not it is possible to fully sever the wafer on the basis of the image captured in the image capturing step; and an adjusting step of increasing a distance by which to lower the cutting blade if it is determined that it is impossible to fully sever the wafer in the determining step.

2. The method according to claim 1, wherein the determining whether or not it is possible to fully sever the wafer in the determining step includes:

checking if there is a cut mark in the image captured in the image capturing step.

\* \* \* \* \*